(12) United States Patent
Kaneko

(10) Patent No.: US 6,258,614 B1
(45) Date of Patent: Jul. 10, 2001

(54) METHOD FOR MANUFACTURING A SEMICONDUCTOR LIGHT-EMITTING DEVICE

(75) Inventor: Yawara Kaneko, Tokyo (JP)

(73) Assignee: LumiLeds Lighting, U.S., LLC, San Jose, CA (US)

( * ) Notice: Subject to any disclaimer, the term of this patent is extended or adjusted under 35 U.S.C. 154(b) by 0 days.

(21) Appl. No.: 08/979,895

(22) Filed: Nov. 26, 1997

Related U.S. Application Data

(63) Continuation of application No. 08/587,166, filed on Jan. 16, 1996, now abandoned.

(30) Foreign Application Priority Data

Jan. 17, 1995 (JP) .................................................... 7-023452

(51) Int. Cl.⁷ .................................................... H01L 21/00
(52) U.S. Cl. ................... 438/22; 438/47; 438/796
(58) Field of Search ................... 437/173, 174, 437/129; 438/796, 36, 46, 47, 795, 22

(56) References Cited

U.S. PATENT DOCUMENTS

| | | | |
|---|---|---|---|
| 4,151,008 | * 4/1979 | Kirkpatrick ........................... | 148/1.5 |
| 4,318,752 | * 3/1982 | Tien ..................................... | 438/796 |
| 4,742,013 | * 5/1988 | menigaux ..................... | 148/DIG. 94 |
| 5,306,662 | * 4/1994 | Nakamura et al. ................... | 437/107 |
| 5,372,836 | * 12/1994 | Imahashi et al. ..................... | 437/173 |
| 5,382,537 | * 1/1995 | Noguchi ................................ | 437/173 |
| 5,426,068 | * 6/1995 | Imaizumi et al. .................... | 437/174 |

FOREIGN PATENT DOCUMENTS

| | | |
|---|---|---|
| 55166975 | 12/1980 | (JP) . |
| 60072287 | 4/1985 | (JP) . |
| WO85 02495 | 6/1985 | (WO) . |

OTHER PUBLICATIONS

Nakamura, Shuji et al.: "Thermal Annealing Effects on P–Type Mg–Doped GaN Films", Japanese Journal of Applied Physics, Feb. 15, 1992, vol. 31, No. 2B, pp. L139–L142.

Nakamura, Shuji et al.; "Hole Compensation Mechanism of p–Type GaN Films", Japanese Journal of Applied Physics, May 1992, vol. 31, No. 5A, pp. 1258–1266.

Amano, Hiroshi et al.; P–Type Conduction in Mg–Doped GaN Treated with Low–Energy Electron Beam Irradiation (LEEBI), Japanese Journal of Applied Physics, Dec. 1989, vol. 28, No. 12, pp. L2112–L2114.

Gladushchak V. I. et al., "Low–Threshold Heterostructure Injection Lasers with Electrical Confinement, Produced by a Pulsed Laser Technique", Soviet Technical Physics Lettes, Aug. 1987, USA, vol. 13, No. 8, pp. 380–382.

* cited by examiner

*Primary Examiner*—Tuan H. Nguyen
(74) *Attorney, Agent, or Firm*—Skjerven Morrill MacPherson LLP; Brian D. Ogonowsky; Rachel V. Leiterman

(57) ABSTRACT

A device with a low resistance zone having confinement, superior reproducibility, and a very high yield comprises a plurality of semiconductor layers, wherein layer resistivity is changed by annealing. The semiconductor layers include a resistance zone having a high activation coefficient of acceptor impurities and a resistance region having a low activation coefficient of acceptor impurities. The activation coefficient is controlled by irradiation with laser light. In addition, laser light is irradiated and absorbed into the semiconductor layers in one part of, or the entire, semiconductor layers, such that layer resistivity in the irradiated regions is changed by annealing resulting from such irradiation.

13 Claims, 7 Drawing Sheets

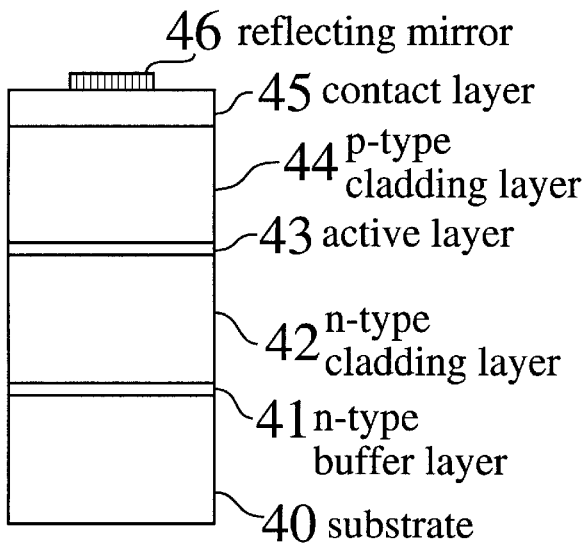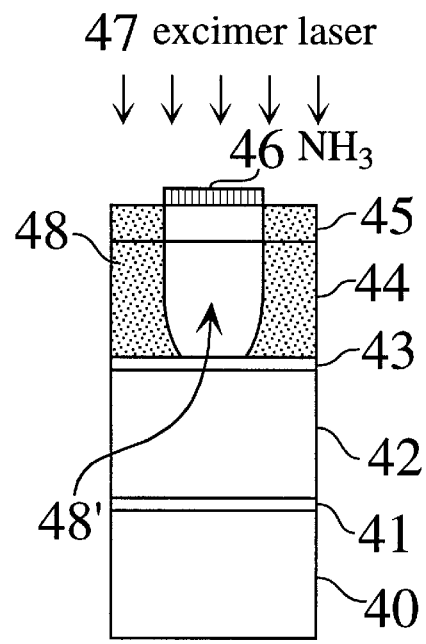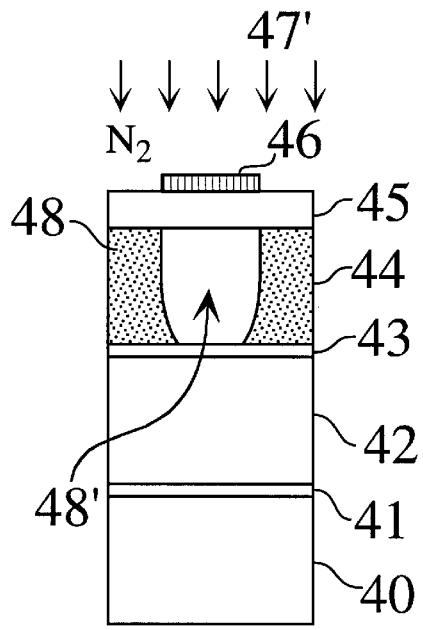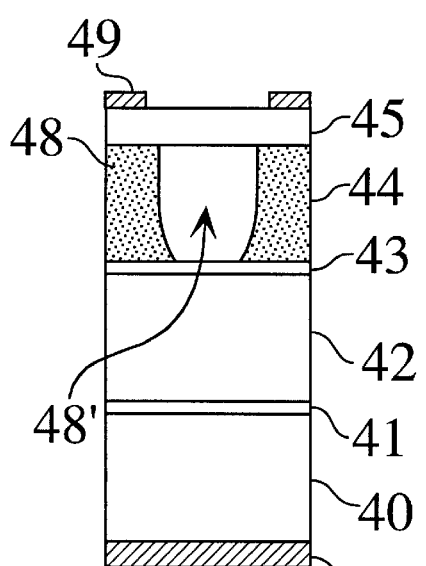
Fig. 6(A)
Fig. 6(B)
Fig. 6(C)
Fig. 6(D)

METHOD FOR MANUFACTURING A SEMICONDUCTOR LIGHT-EMITTING DEVICE

CROSS REFERENCE TO RELATED APPLICATIONS

This is a continuation of copending application Ser. No. 08/587,166 filed on Jan. 16, 1996, now abandoned.

BACKGROUND OF THE INVENTION

1. Technical Field

The invention relates to a semiconductor device that can be used as a light-emitting device and to a method of manufacturing such device. In particular, the invention relates to a semiconductor light-emitting device and its manufacturing method, where the confinement structure and low resistance areas are easily formed, the reproducibility thereof is superior, and the yield thereof is very high.

2. Description of the Prior Art

As shown on FIG. 1, a semiconductor laser having a layered structure is formed from a substrate 70, n-type cladding layer 71, active layer 72, and p-type cladding layer 73. A top electrode 74 and a bottom electrode 75 are placed at the two ends of this layered structure.

When current is injected into the active layer 72 from the top electrode 74, light resonance arises in the active layer 72 and laser light 76 is emitted in a prescribed direction, e.g. in a perpendicular direction for vertical cavity surface emitting lasers. Because current is supplied to the active layer 72 from the top electrode 74, the p-type cladding layer 73 must have a low resistivity (generally, about $1\Omega\cdot cm$). Japanese Unexamined Patent Publication No. 5-183189 disclosed a technology that may be used to make a low resistivity p-type cladding layer 73.

In the semiconductor laser device having the form shown on FIG. 1, the p-type cladding layer 73 extends over the entire structure and has uniform resistivity. Accordingly, the following problems arise:

Light emission efficiency decreases;

Threshold current at the start of oscillation becomes large;

The device is easily destroyed by the generation of heat; and

During oscillation operation the device becomes unstable.

A known solution to the above problems is to use a conventional current-confined semiconductor laser device, as shown in FIGS. 2(A) to 2(C). The laser device in FIG. 2(A) has a planar stripe structure in which an n-type contact layer is formed on a p-type cladding layer; and in which a top electrode is formed after Zn that is diffused in a striped form reaches the p-type cladding layer through the n-type contact layer. The structure is referred to as a confinement type structure, although the current spread in such device is large and the degree of confinement is poor.

The laser device shown on FIG. 2(B) has a proton implanted structure. In this device, a p-type contact layer is formed on a p-type cladding layer. The top electrode is formed in a striped part that remains after protons are implanted. To make this structure, it is necessary to control the amount of implantation of the protons. Because this process exhibits inferior reproducibility, it is not easy to use the process to fabricate devices of uniform quality.

The laser device shown on FIG. 2(C) has a buried heterostripe structure and, as such, it is layered with an n-type cladding layer, an active layer, a p-type cladding layer on an n-type substrate (InP), a top electrode, and a bottom electrode. This structure exhibits excellent current confinement because the p-type cladding layer has a confinement structure. However, in forming the confinement structure, manufacturing becomes complex because etching and regrowth are essential steps.

For laser devices, such as those shown on FIGS. 2(A) to 2(C), where the laser device has a current-confined structure, processing cannot usually be repeated when a processing error occurs. Therefore, such processes as are used to produce these devices result in poor yields and an accompanying negative effect on manufacturing costs.

Except for the structure of FIG. 2(C), generally, when a structure that confines the current in the light emitting area is formed in a laser device, the bonding area between the contact layer and electrode layer necessarily becomes narrow. As a result, the contact resistance between the semiconductor and metal becomes large, Joule heat arises in the contact while the element is operating, and the characteristics of the element deteriorate.

An annealing method that consists of heating by a heater and electron beam radiation, in addition to laser light radiation, produces problems related to local heating when the device is heated by the heater. Consequently, a method other than local heating must be devised to form the current-confinement structure. For electron beam radiation, local heating is possible. However, because the electron beam scans, annealing by this technique takes considerable time and therefore significantly reduces process productivity.

SUMMARY OF THE INVENTION

The invention provides a semiconductor device, in particular a light-emitting semiconductor device, e.g. a semiconductor laser device, or a semiconductor LED device, and a method for manufacturing same. The device has superior current confinement, is easily manufactured, has superior reproducibility, and has improved yield, as well as allowing ample degrees of freedom in designing the confinement.

The manufacturing method herein described includes a step that irradiates the light-emitting device with laser light at a wavelength that is absorbed in the semiconductor layer in a part of, or the entire, semiconductor layer, such that the resistivity of the semiconductor layer is changed by annealing produced by said laser light in said irradiated zone. The exemplary embodiment of the invention provides a p-type semiconductor, although the same laser annealing step can be implemented for an n-type semiconductor.

In the invention, such annealing is accomplished by using laser light irradiation (hereinafter called laser annealing) to decrease or increase the resistance in a part of, or the entire area of, the p-type semiconductor layer. If laser annealing is performed under specific conditions, i.e. in an atmosphere of $N_2$, in a part of or the entire area of the p-type semiconductor layer where the activation coefficient of the acceptor impurities is low (that is, for high resistance), the area can attain a low resistance. In contrast, if laser annealing is performed under specific conditions, i.e. in an atmosphere of $NH_3$, in a part of or the entire area of the p-type semiconductor layer where the activation coefficient of the acceptor impurities is high (that is, for low resistance), the area can attain a high resistance.

The manufacturing method applies to a p-type semiconductor layer that is formed by a single crystal growth process having a resistivity that is changed by annealing. According to this method, a semiconductor device is fabricated in which the semiconductor layer includes a low resistance zone where the activation coefficient of the acceptor impurities is high, and a high resistance zone where the activation coefficient of the acceptor impurities is low.

When the herein described manufacturing method is used, a light-emitting device, e.g. laser device or LED device (including the surface emitting type), can be manufactured with or without stripes. In addition, the invention can be used to manufacture a variety of layered structures, such as double hetero structures or single hetero structures. For example, if a double heterostructure is adopted, the n-type cladding layer, active layer, and p-type cladding layer are layered in this or the opposite order. Laser annealing can be used in such structures to create a low resistance region, where the activation coefficient of the acceptor impurities is high, and a high resistance region, where the activation coefficient of the acceptor impurities is low, in parts of the p-type cladding layer.

Furthermore, when the herein described manufacturing method is used, a p-type semiconductor layer can be easily manufactured, where the low resistance region provides confinement. Thus, a confinement type, low resistance region can be formed by laser annealing to give a part of the p-type semiconductor layer either low or high resistance.

In the former case, laser light at a wavelength that is absorbed into the high resistance p-type semiconductor is converged or diverged by a lens or mask and irradiated to form a high resistance p-type semiconductor. That is, laser annealing is used to form a confinement type, low resistance region.

In the latter case, a reflecting mirror is formed in a part of the top surface, or upper region, of the low resistance p-type semiconductor layer. Laser light is irradiated at a wavelength that is absorbed into the p-type semiconductor layer. In other words, laser annealing is used to form a confinement region that does not have a high resistance (that is, it is a low resistance region).

The herein described manufacturing method uses to advantage the difference in the optical absorption spectrum due to components of the material. For example, a characteristic laser light having a specific wavelength is absorbed in p-type semiconductor of a certain composition, but it is not absorbed into a p-type semiconductor of some other compositions. Thus, a light-emitting device having a layered structure consisting of a semiconductor layer including a confinement type, a low resistance region, and a semiconductor layer exhibiting low resistance over the entire region can be manufactured.

When manufacturing a light-emitting device having a double heterostructure, the p-type cladding layer and p-type contact layer are layered in the following order: n-type cladding layer, active layer, and p-type cladding layer. These layers are formed from p-type semiconductor layers having resistivities that are lowered by annealing. In addition, a p-type contact layer is formed on a p-type cladding layer. Specifically, materials are selected so that a forbidden band gap of the p-type contact layer becomes smaller than a forbidden band gap of the cladding layer.

Laser light having a wavelength that is absorbed into the p-type contact layer and p-type cladding layer is irradiated from the contact layer side of the layered structure to form a confinement type, low resistance region in the p-type cladding layer. Laser light having a wavelength that is absorbed into the p-type contact layer but is then transmitted through the p-type cladding layer is irradiated from the contact layer side of the layered structure to develop low resistance only in the p-type contact layer. These steps can be used to manufacture a light-emitting device that has a layered structure having a p-type cladding layer with a confinement type, low resistance region and a p-type contact layer exhibiting low resistance over the entire area.

Annealing can be performed by heating a part of, or the entire, semiconductor device and irradiating the device with laser light, or it can be performed by cooling a part of, or the entire, semiconductor device and irradiating the device with laser light. By using this supplemental heating or cooling, a spatial temperature gradient is obtained in a specific area of the p-type semiconductor, such that annealing can be performed.

There are two methods that can be used for laser annealing, i.e. continuous laser irradiation, and pulsed laser irradiation:

In continuous irradiation, the temperature distribution in the sample attains a steady state. The temperature reaches its maximum in the part of the device that absorbs the laser light, and becomes lower in the part of the device with no absorption away from the absorption part.

In contrast, in pulsed irradiation the temperature distribution in the sample changes over time. At the instant of the pulsed irradiation, the temperature in the absorption part increases, but it takes a relatively long time until the heat generated by the absorption diffuses. Therefore, the temperature surrounding the absorption part does not increase immediately. As a result, an extremely steep temperature gradient can occur at the boundary between the absorption region and the non-absorption region. Consequently, for pulsed irradiation, a more abrupt change in resistivity can be created between the absorption region and non-absorption region than in continuous irradiation. By adjusting the strength and pulse width of the laser light, a variety of resistivity gradients can be formed.

It is difficult to form widths smaller than several microns to 10 microns for the resistance regions in the conventional Zn-diffusion type device shown in FIG. 2(A), and the conventional proton implantation type device shown in FIG. 2(B). In contrast, because laser light is used herein, by converging the light with a lens, annealing in the range of the wavelength of the laser light (1 m or less) is possible. Accordingly, by adjusting the beam focus, a light-emitting device having a low resistance region in a shape (that is, a confinement shape having an extremely narrow end) that was usually difficult to create in manufacturing using conventional techniques can be manufactured. In addition, low resistance regions can be formed in very narrow regions (about the wavelength of laser light), as well as confinement shapes.

A plurality of photolithography processes are required to manufacture a conventional buried hetero-stripe structure device shown in FIG. 2(C). In contrast, when the invention is used to form low resistance regions during manufacturing, photolithography processes become unnecessary or few in number, and manufacturing is thus simplified.

In addition, even when processing errors occur during the manufacturing process, various steps of such process can be repeated because the semiconductor layers can be made low resistance or high resistance repeatedly under specific conditions, thus significantly improving device yields.

BRIEF DESCRIPTION OF THE DRAWINGS

FIGS. 6(A) to 6(D) illustrate an embodiment of the invention by which the semiconductor device (light-emitting device) is manufactured;

DETAILED DESCRIPTION OF THE INVENTION

The following is an example of one embodiment of a semiconductor light-emitting device made in accordance with the invention, where the device so fabricated is a semiconductor laser.

A variety of semiconductor materials can be used in the invention. For reference, Table 1 lists specific examples of combinations of compounds used in the active layer, p-type cladding layer, and contact layer when manufacturing a double heterostructure light-emitting device. Instead of N in Table 1, P or As can be used, or compounds mixing N, P, and As (for example, GaNP or GaNAs) can be used. In Table 1, entries on the impurity dopant are omitted.

TABLE 1

| Active Layer | Cladding layer | Contact Layer |
|---|---|---|
| InGaN | GaN | InGaN |
| InGaN | AlGaN | InGaN or GaN |
| GaN | AlGaN | InGaN or GaN |
| AlGaN | AlGaN | InGaN or GaN |
| BgaInN | BAlGaN | BInN or BGaN |
| BgaN | BAlN | BInN or BGaN |

Figure 1:
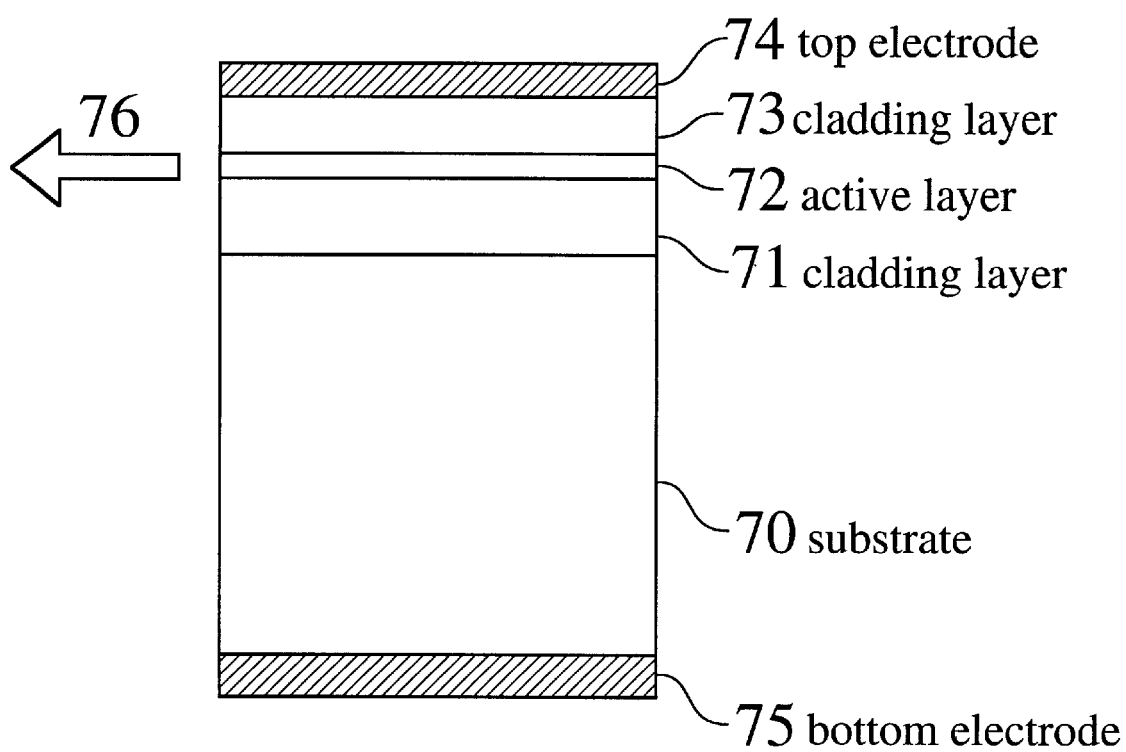
FIG. 1 illustrates a conventional semiconductor laser.
Figure 2A:
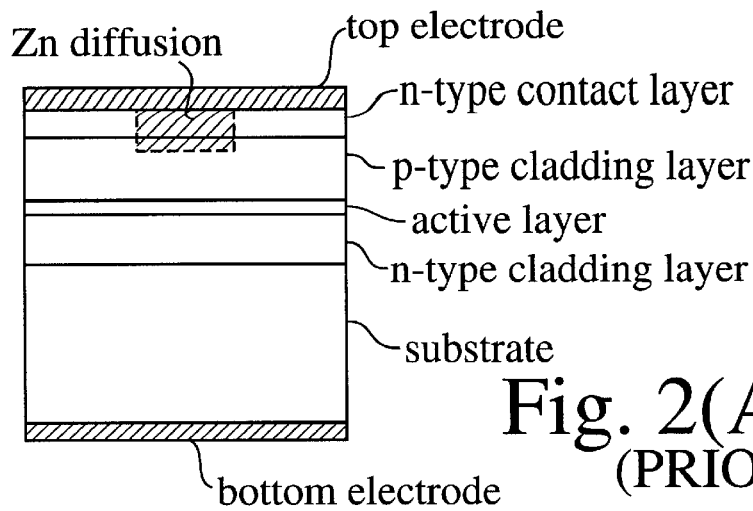
FIGS. 2(A) to 2(C) illustrate a conventional current-confined semiconductor laser.
Figure 2B:
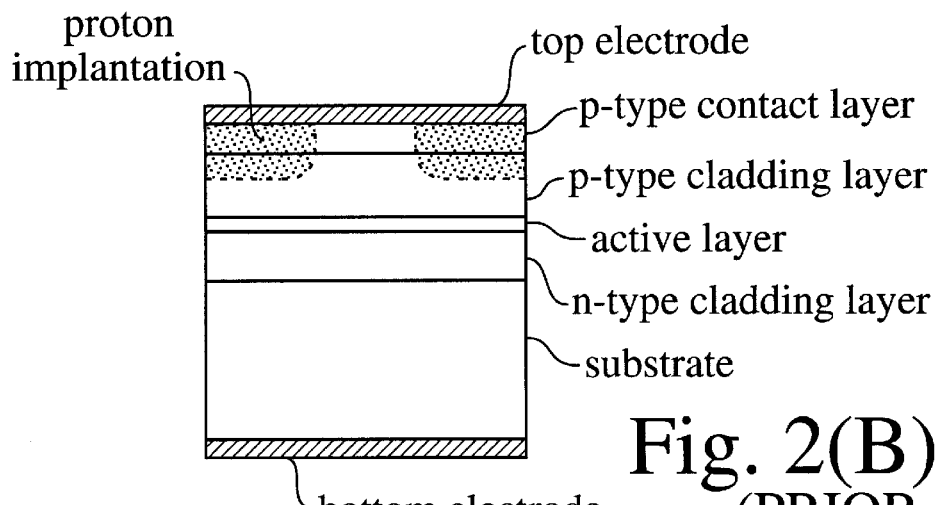
Figure 2C:
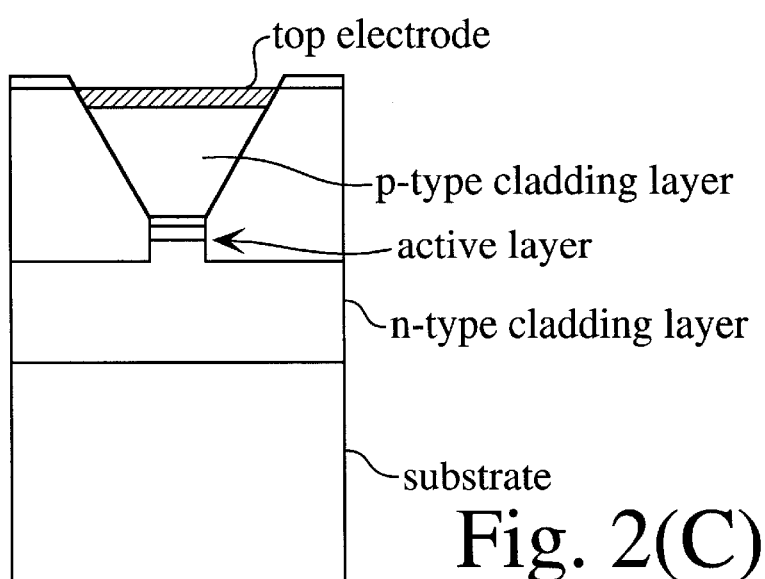
Figure 3A:
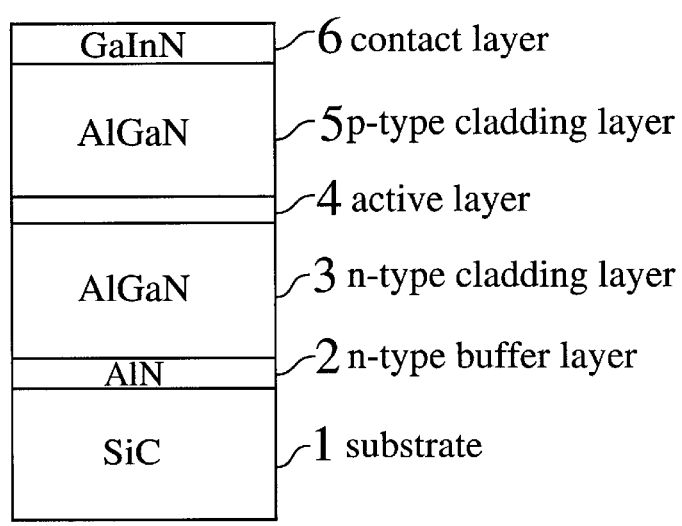
FIGS. 3(A) to 3(E) illustrate an embodiment of the invention by which a semiconductor device (light-emitting device) is manufactured.

As illustrated in FIG. 3(A), the n-type cladding layer 3 is formed on an n-type buffer layer 2 which lies on the n-type substrate 1 (SiC in this embodiment), and an active layer 4 is formed on top. A p-type cladding layer 5 (p-type AlGaN doped with Mg) is then formed on top of the active layer 4.

A contact layer 6 for ohmic contact is formed on the p-type cladding layer 5. In this embodiment, AlN is used to form the n-type buffer layer and n-type AlGaN doped with Si is used to form the n-type cladding layer 3. The forbidden band gap of the contact layer 6 must be smaller than the forbidden band gap of a p-type cladding layer 3. Here, p-type AlGaN is used to form the p-type cladding layer 5 and p-type GaInN is used to form the contact layer 6.

Conventional techniques, such as liquid phase epitaxy, vapor phase epitaxy (VPE), metal organic vapor phase epitaxy (MOVPE), and molecular beam epitaxy (MBE) may be used as the crystal growing techniques in the manufacturing method of the invention. A crystal growth method employing MBE is adopted in the exemplary embodiment. After forming the p-type cladding layer 5, the cladding layer 5 and contact layer 6 exhibit low resistance.

Figure 3B:
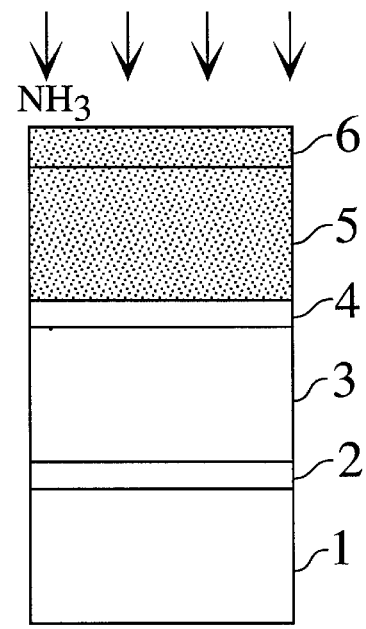

As shown in FIG. 3(B), laser annealing is performed in an atmosphere of NH$_3$, and the p-type cladding layer 5 and the contact layer 6 then exhibit high resistance. In laser annealing, laser light having a wavelength which is absorbed into a p-type cladding layer 5 and contact layer 6 is used. In this case, instead of laser annealing, another annealing technique employing electron beams can also be used. It should be noted that when manufacturing using an MOCV method, for example, because the cladding layer 5 becomes high resistance when forming the p-type cladding layer 5, the step of annealing under the atmosphere of NH$_3$ can be omitted.

Figure 3C:
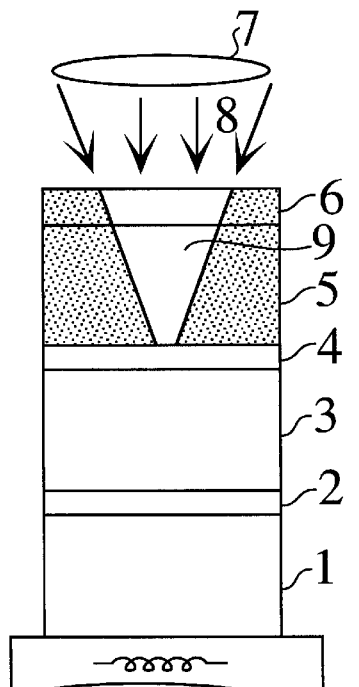

As illustrated in FIG. 3(C), laser light (in this embodiment, an excimer laser light 8 having a wavelength of 248 nm) is irradiated in pulses having a wavelength that is absorbed in both the p-type cladding layer 5 and the contact layer 6 on the p-type cladding layer 5 (specifically, from the top of the contact layer 6) in an N$_2$ atmosphere. Because this laser light 8 is converged by a rod lens 7, the irradiated region 9 exhibits both confinement shape and low resistance. This development of low resistance is thought to be the result of the removal of hydrogen in the irradiated region 9 and the activation of the acceptor impurities.

As shown in FIG. 3(C), the irradiated width in the boundary between the p-type cladding layer 5 and the active layer 4, and that in the boundary between the contact layer 6 and the p-type cladding layer 5 are 1 m and 2 m, respectively. Although not clearly shown in FIG. 3(C), the confinement shape of the laser light 8 irradiating through the rod lens 7 forms a wedge shape. Therefore, the low resistance region assumes the same shape. In the invention, the confinement structure produced by the laser light may have an inverted cone shape. For such purposes, a surface emission laser formed in the same shape as the low resistance region can be manufactured.

One problem associated with control of the annealing temperature is that if the annealing temperature is too low, the annealing result disappears, and if it is too high, annealing is performed in areas where a lower resistance than desired is caused by heat conduction. Consequently, an approximate annealing temperature of from about 5000° C. to about 700° C. is suitable, but about 600° C. is presently thought to be ideal.

When the desired annealing temperature cannot be obtained, bias heating is performed by an auxiliary heater 20, as shown in FIG. 3(C). The temperature for bias heating is appropriately controlled in response to the thickness of the p-type cladding layer 5. When the temperature is too high, regions which should have a high resistance are heat annealed and become low resistance.

Figure 3D:
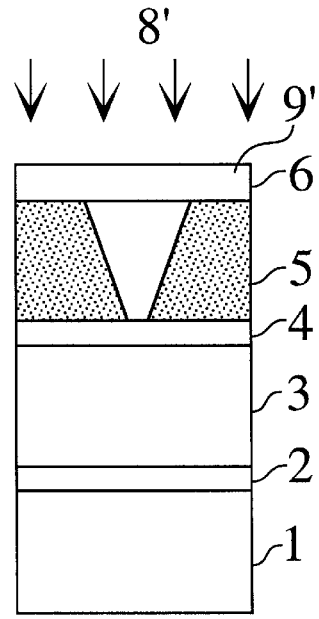

As shown in FIG. 3(D), an excimer laser light 8' having a wavelength of 351 nm irradiates in pulses from the top of the contact layer 6 in an atmosphere of N$_2$. The laser light 8' is absorbed in the contact layer 6, and the irradiated region 9' is annealed. Annealing by the laser light 8' activates acceptor impurities in the contact layer 6. Because the 351 nm laser light 8' is transmitted through the p-type cladding layer 5 (i.e. it is not absorbed by the p-type cladding layer 5), the p-type cladding layer 5 is not annealed. Accordingly, the current-confinement structure of the p-type cladding layer is maintained unchanged, and the contact layer can have a low resistance. Even in this situation, an approximate annealing temperature of from about 600° C. to about 700° C. is suitable, but about 600° C. is presently thought to be ideal. As above, a low resistance region is formed in the contact layer 6.

Figure 3E:
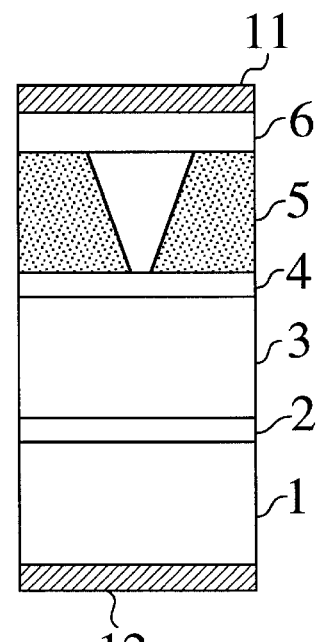

As shown in FIG. 3(E), the top electrode 11 is formed in contact with the low resistance region formed in the contact layer 6. The bottom electrode 12 is formed on the bottom of the substrate 1, as shown on FIG. 3(E). By adding a few modifications to the processes illustrated on FIGS. 3(A) to 3(E), a vertical cavity surface emitting laser can be manufactured. As is easily understandable by persons skilled in the art, an aperture is opened in the top electrode 11 in this case. Reflecting mirrors are formed in the aperture in the top electrode 11 between the substrate 1 and the n-type cladding layer 3.

In the above-mentioned embodiment, bias heating is performed by an auxiliary heater 20, but bias heating can be omitted under some conditions, for example when the desired annealing temperature can be obtained by laser light 5 irradiation.

A cooler can be provided instead of the auxiliary heater 20. The cooler can increase the temperature gradient in the boundary between the laser light irradiated region and the non-irradiated region in the p-type cladding layer 5. Thus, the spatial resistivity transition from the low resistance region to the high resistance region becomes very steep.

Figure 4A:
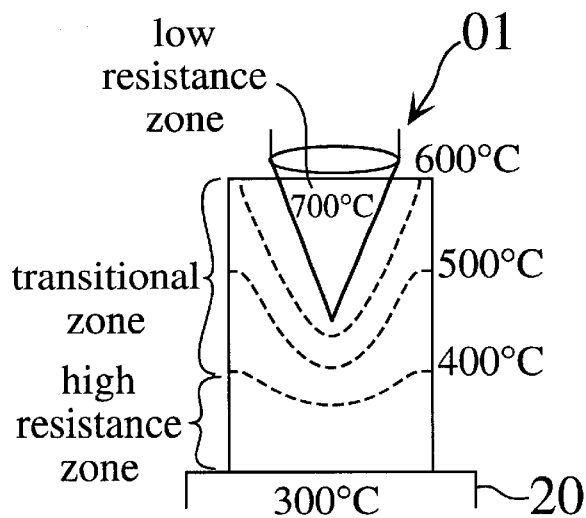
FIGS. 4(A) and 4(B) illustrate the operation of the invention when using an auxiliary heater and cooler.
Figure 4B:
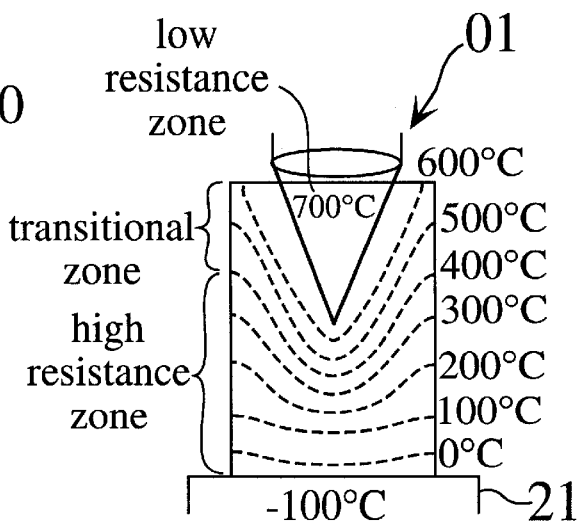

FIGS. 4(A) and 4(B) illustrate the contours (i.e. lines of equal resistivity) tracing spatial changes in resistance from the low resistance region to the high resistance region. FIG. 4(A) shows the case using the auxiliary heater 20. FIG. 4(B) shows the case using the cooler 21. In FIG. 4(A), the temperature of the auxiliary heater is about 300° C. In FIG. 4(B), the cooling temperature is about −100° C. The annealing temperature for each is about 700° C. The light-emitting device is indicated by 01. The spatial temperature gradient along the periphery of the region that is laser annealed can be controlled by the auxiliary heater or cooler.

Figure 5:
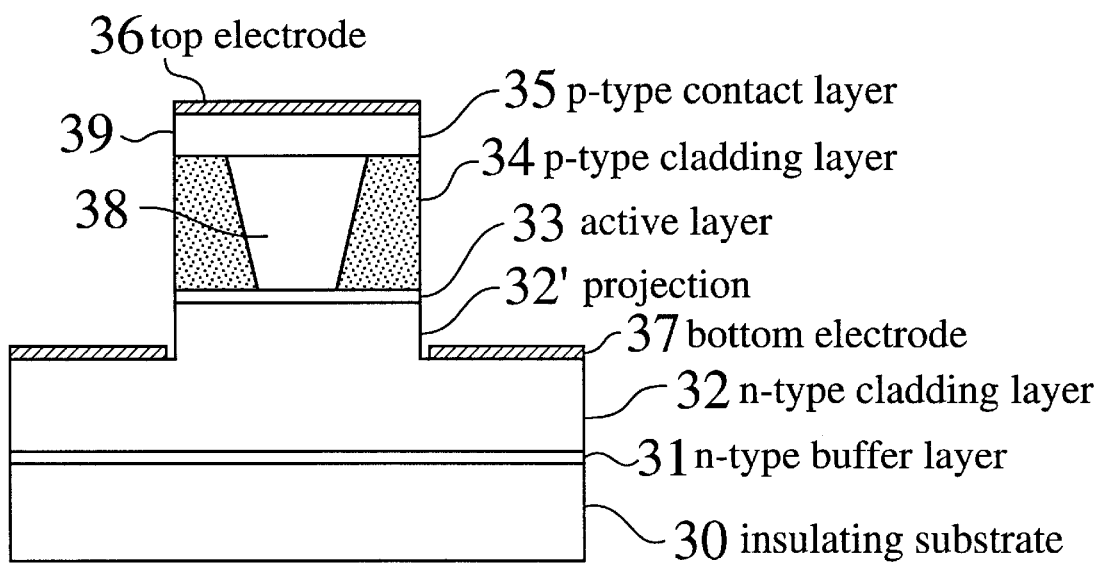
FIG. 5 illustrates another embodiment of the invention in which a semiconductor device (light-emitting device) having an insulating substrate is manufactured.

FIG. 5 shows a light-emitting device in which an insulator is used as the substrate. In the device in the same figure, an n-type buffer layer 31, n-type cladding layer 32, active layer 33, p-type cladding layer 34, and p-type contact layer 35 are layered and formed on an insulating substrate 30. After forming the current-confinement structure using laser annealing, the top electrode 36 is formed. Then, the projection 32' is formed in the region above the center of the n-type cladding layer 32 by etching to remove the shape, such that only the neighboring confinement region remains.

The bottom electrode 37 is formed on the part of the n-type cladding layer 32 that is not a part of the projection. In the light-emitting device shown in FIG. 5, similar to the light-emitting device shown in FIG. 3, the low resistance zone 38 of the p-type cladding layer 34 and low resistance zone 39 of the p-type contact layer 35 are confinement structures. Because the method for forming the confinement shape is similar to that for the device of FIGS. 3 or 4, it is omitted here.

FIGS. 6(A) to 6(D) illustrate another embodiment of the invention. As shown on FIG. 6(A), the substrate 40 (n-type SiC), buffer layer 41 (n-type AlN), n-type cladding layer 42 (n-type ALGaN doped with Si), active layer 43 (undoped GaInN), p-type cladding layer 44 (p-type AlGaN doped with Mg), and contact layer 45 (p-type GaInN) for obtaining an ohmic contact are formed. This is the same as for the structure shown on FIG. 3(A).

A reflecting mirror 46 is formed on the contact layer 45. In the above process, MBE is used as in the embodiment shown on FIG. 3. When MBE is used, the acceptor impurities are activated immediately after forming the p-type cladding layer 44, and the p-type cladding layer 44 becomes low resistance. If the light-emitting device is manufactured by MOCV, the acceptor impurities are inactive in the cladding layer 44 when the p-type cladding layer 44 is formed. That is, the cladding layer 44 becomes high resistance. Consequently, the low resistance must be created by performing a suitable procedure on the p-type cladding layer 44 in an $N_2$ atmosphere, such as heat annealing or irradiating by an excimer laser light having a 248 nm wavelength.

As shown on FIG. 6(B), an excimer laser light 47 having a 248 nm wavelength irradiates in pulses on the p-type cladding layer 44 (specifically, from the top of the contact layer 45) in an atmosphere of $NH_3$. The laser light 47 irradiates a portion excluding the part directly below the reflecting mirror 46 in the contact layer 45 and p-type cladding layer 44. The acceptor impurities in the irradiated region 48 are not activated. The part 48 excluding the part 48' directly below the reflecting mirror 46 in the contact layer 45 and p-type cladding layer 44 becomes high resistance. The part 48' directly below the reflecting mirror 46 remains at a low resistance and becomes a confinement structure.

As shown on FIG. 6(C), an excimer laser light 47' having a 351 nm wavelength irradiates in pulses from the top of the contact layer 45 in an atmosphere of $N_2$. The laser light 47' is absorbed in the contact layer 45. In this case, the 351 nm laser light 47' is transmitted through the p-type cladding layer 44 as in the previous embodiment. That is, it is not absorbed by the p-type cladding layer 44. Thus, the p-type cladding layer 44 is not annealed. The p-type cladding layer 44 retains the confinement structure, and the contact layer 45 becomes low resistance.

As shown in FIG. 6(D), the reflecting mirror 46 is removed by etching, and the top electrode 49 is formed in contact with the low resistance region formed on the contact layer 45. The bottom electrode 49' is formed on the bottom of the substrate 40. As a result, a laser device is formed in which the low resistance region is a confinement type structure.

When the reflecting mirror 46 is not removed, a vertical cavity surface emitting laser that uses the reflecting mirror in a part of the element can be manufactured. In this case, the reflecting mirror must be formed beforehand between the buffer layer 41 and the n-type cladding layer 42.

Figure 7A:
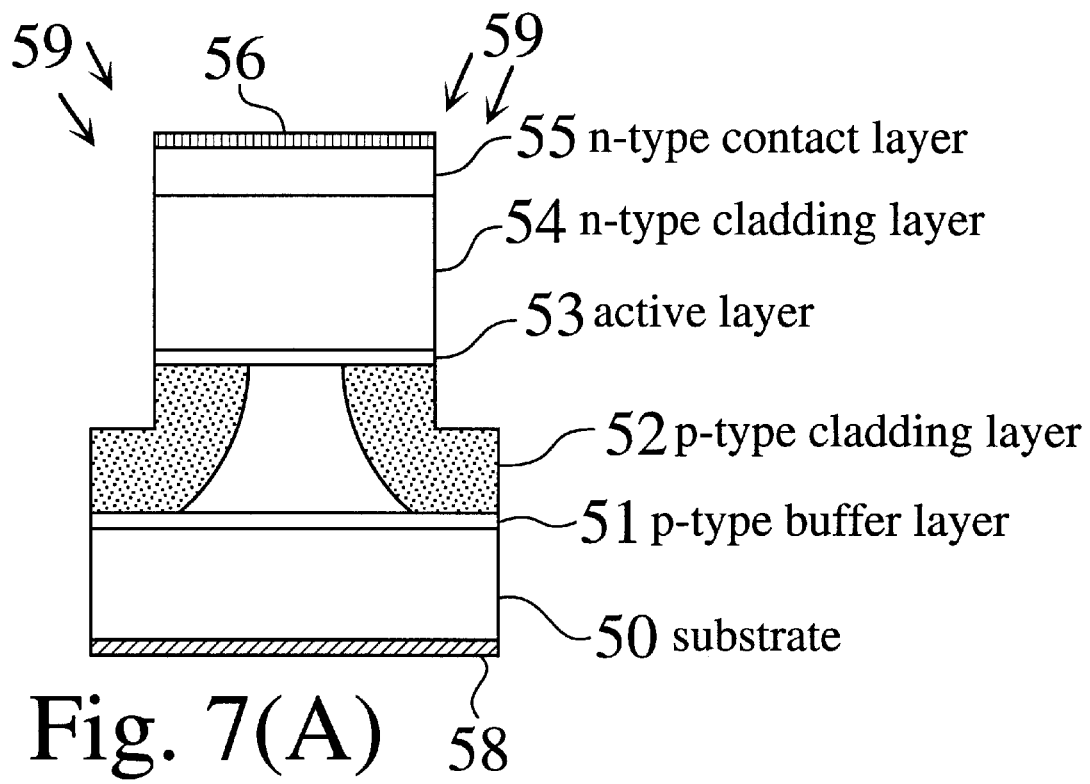
FIGS. 7(A) and 7(B) illustrate an embodiment in which a semiconductor device (light-emitting device) having a p-type substrate is manufactured.
Figure 7B:
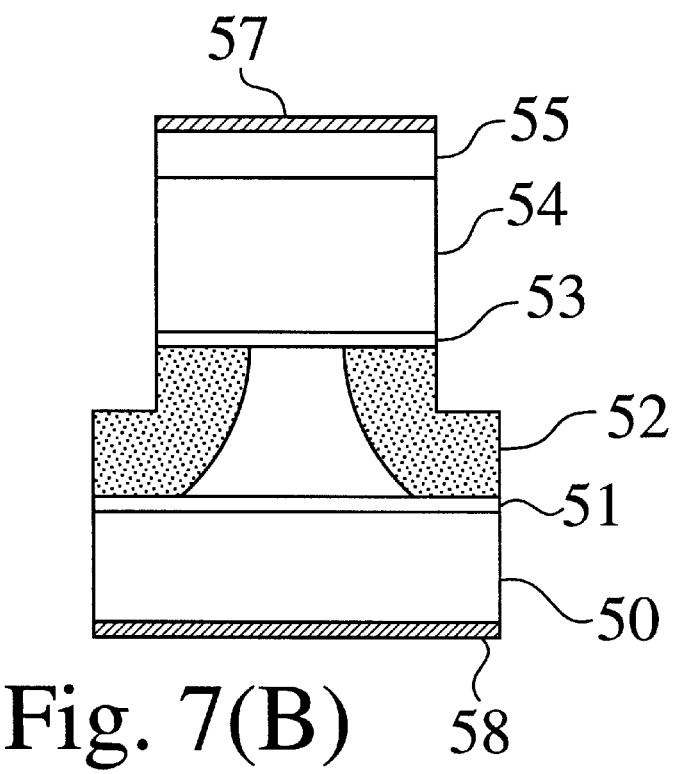

As shown on FIGS. 6(A) to 6(D), an n-type substrate is used to form a light-emitting device, but a p-type substrate can also be used, as illustrated on FIGS. 7(A) and 7(B). In FIG. 7 (A), a p-type buffer layer 51, p-type cladding layer 52, active layer 53, n-type cladding layer 54, and n-type contact layer 55 are formed on a p-type substrate 50. The bottom electrode 58 is formed on the bottom of the layered structure, and a reflecting mirror 56 is formed on the top. As shown on FIG. 7(A), by irradiating laser light 59 having a wavelength that is absorbed by the p-type cladding layer 52 from the top of the reflecting mirror 56, a high resistance region is formed as indicated by the hatching on FIG. 7(A). By removing the reflecting mirror 56 and adding the top electrode 57 layer, the light-emitting device shown on FIG. 7(B) is fabricated.

Figure 8A:
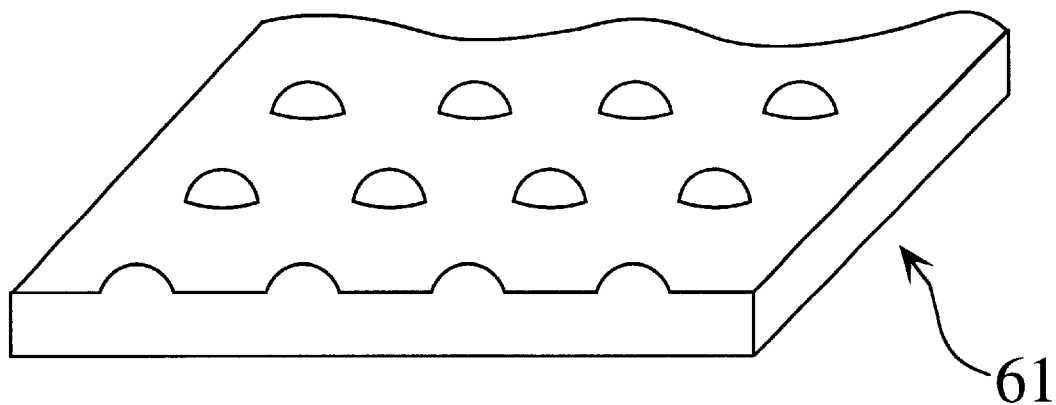
FIGS. 8(A) and 8(B) illustrate a microlens used in the manufacturing method of the invention.

In the embodiments described above, an example of fabricating one laser device on the substrate was described for convenience. However, a microlens array can be used and a plurality of laser devices can be fabricated on the substrate. FIG. 8(A) shows one example of a microlens array. If the microlens array 61 in the figure is used, a plurality of non-striped (i.e. surface emission) laser devices can be manufactured at one time.

Figure 8B:
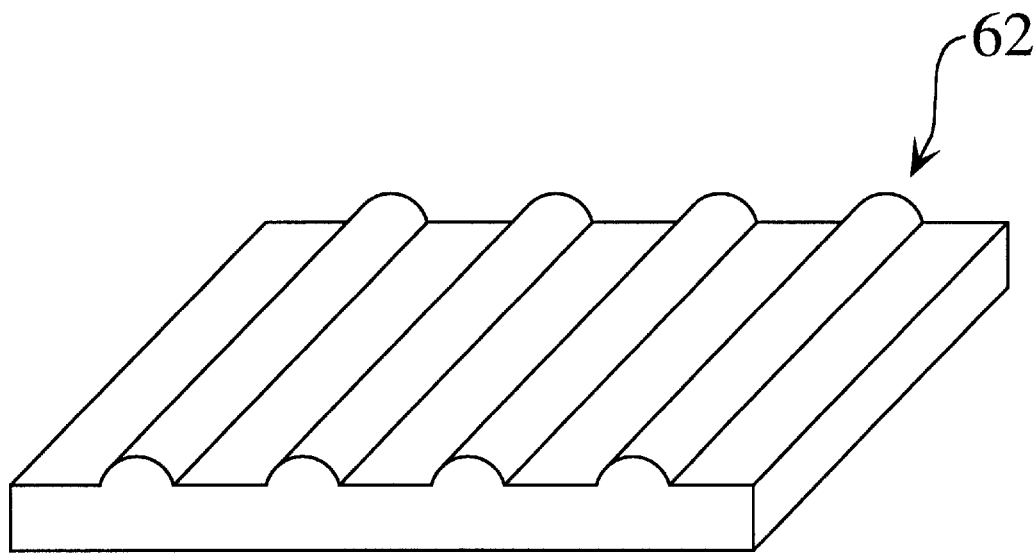

A manufacturing method for laser devices having a striped rod lens array is shown on FIG. 8(B). In the above embodiments, laser devices were described, however the manufacturing process can also be used to fabricate LED devices.

As explained above, a semiconductor device is formed that contains semiconductor layers in which the layer resistivities are changed by annealing. Such device includes semiconductor layers composed of a low resistance area, where the acceptor impurities have a high activation coefficient, and a high resistance area, where the acceptor impurities have a low activation coefficient. Control of the activation coefficients is effected by irradiation of the device with laser light.

The semiconductor device may be formed having p-type semiconductor layers in which the layer resistivities are changed by annealing device features. The manufacture of such device involves forming p-type semiconductor layers from a low resistance region, where the activation coefficient of acceptor impurities is high, and a high resistance region, where the activation coefficient of acceptor impurities is low. The activation coefficients are controlled by irradiation of the device with laser light.

The semiconductor device may be used as a light-emitting device by forming a double heterostructure having a n-type cladding layer, active layer, and either a p-type cladding layer or another heterostructure.

In the semiconductor device, the p-type cladding layer may be a p-type semiconductor layer formed from a low resistance region, where the activation coefficient of acceptor impurities is high, and a high resistance region, where the activation coefficient of said impurities is low.

The semiconductor device may be formed such that a contact layer is provided that becomes ohmic and that is in contact with a specified electrode on the opposite side of the active layer side of the p-type cladding layer.

The semiconductor device may also include a low resistance region that forms a confinement structure surrounded by the high resistance region. The semiconductor device may have a contact layer that is a p-type semiconductor layer, wherein a forbidden band gap is smaller than that of the cladding layer. Such contact layer has a resistivity which is changed by annealing. The contact layer is formed from a low resistance region, where the activation coefficient of acceptor impurities is high, and the acceptor impurities are activated in the low resistance region by irradiation with laser light.

In addition, the manufacturing method herein may include a step to irradiate laser light having a wavelength that is absorbed in the semiconductor layer in a part of, or the entire, region of the semiconductor layer, to thereby change the resistivity of the irradiated region by annealing that results therefrom. In particular, the manufacturing method may include a step that irradiates laser light having a wavelength that is absorbed in the p-type semiconductor layer in a part of, or the entire, region of the p-type semiconductor layer, wherein the resistivity is changed by annealing, thereby changing the resistivities of said irradiated area.

The manufacturing method may be used to fabricate a light-emitting device featuring a p-type cladding layer that has a double heterostructure of an n-type cladding layer, an active layer, and either a p-type cladding layer or another heterostructure that is formed from a p-type semiconductor layer, wherein the resistivity is changed by annealing. This embodiment of the invention may include a step that changes the resistivity of the irradiated region by irradiating laser light on a part of, or the entire region of, the p-type semiconductor layer.

The manufacturing method may also include a step to irradiate laser light having a wavelength that is absorbed in a part of, or the entire, p-type semiconductor layer, that changes the resistivity of the irradiated region, and that makes the low resistance region in the p-type semiconductor layer a confinement structure.

The manufacturing method may also include a step to irradiate laser light having a wavelength that is absorbed in a part of, or the entire, p-type semiconductor layer, and that changes the resistivity of the irradiated region, such that the laser light irradiates and is converged by a lens to cause the irradiated region to become low resistance.

The manufacturing method may also include a step to irradiate laser light having a wavelength that is absorbed into a part of, or the entire, p-type semiconductor layer and that changes the resistivity of the irradiated region. Such step also forms a reflecting mirror in a part of the region to be irradiated by the laser light, blocks the laser light in that part, and lowers the resistance in the region irradiated by the laser light.

When the manufacturing method is employed where the semiconductor device is a light-emitting device, the method includes the steps of forming a p-type cladding layer and p-type contact layer from a structure consisting of a double heterostructure of, in order, an n-type cladding layer, an active layer, a p-type cladding layer, and a p-type contact layer layered on the p-type cladding layer, where the double heterostructure has its resistivity lowered by annealing. Such method includes a step that irradiates laser light having a wavelength that is absorbed in the p-type contact layer and p-type cladding layer through the contact layer of said layered structure, and a step where the contact layer of the structure is irradiated with laser light having a wavelength that is absorbed into the p-type contact layer, but transmitted through the p-type cladding layer.

The manufacturing method may also involve heating a part of, or the entire, semiconductor device, irradiating laser light, and annealing; cooling a part of or the entire semiconductor device, irradiating laser light, and annealing; and/or irradiating laser light in pulses and annealing.

Thus, the invention provides a semiconductor light-emitting device in which the current confinement is superior compared to a light-emitting device manufactured by conventional Zn doping. The invention provides a method that produces a device having high precision and many degrees of freedom in the confinement structure and that can create a confinement type, low resistance region.

In addition, the manufacturing process is simplified in each step, compared to light-emitting devices fabricated by conventional etching. Because activation of the acceptor impurities can be performed by laser annealing, controlling the annealing process is simple. Accordingly, when the invention herein is compared to the technology presently in use to produce a low resistance region confinement, e.g. etching and Zn doping, the formation of a confinement type, low resistance region is relatively simple.

Even when there is some processing error in the process to maintain conductivity in the semiconductor layer, the process can be redone by activating or deactivating the acceptor impurities. Therefore, device yield is significantly increased.

Although the invention is described herein with reference to the preferred embodiment, one skilled in the art will readily appreciate that other applications may be substituted for those set forth herein without departing from the spirit and scope of the present invention. Accordingly, the invention should only be limited by the Claims included below.

What is claimed is:

1. A method of forming a three-dimensional region of modified resistivity in a semiconductor device, the three-dimensional region having a desired shape, the method comprising:

forming a plurality of semiconductor layers comprising a p-type cladding layer and a p-type contact layer;

providing a first beam of laser light having a first wavelength which is absorbed in said p-type contact layer and said p-type cladding layer the beam having a shape in a plane parallel to said semiconductor layers corresponding to said desired shape in said plane;

irradiating said semiconductor layers with said first beam of laser light without relative lateral motion between said beam and said semiconductor layers, said laser light having a first wave length and penetrating to a predetermined depth in said semiconductor layers, wherein resistivity of said semiconductor layers absorbing said laser light having a first wavelength is changed by selective annealing effected in said semiconductor layers by said irradiation;

providing an additional beam of laser light having a second wavelength which is absorbed in said p-type contact layer but which transmitted through said p-type cladding layer, and irradiating said semiconductor layers with said additional beam of laser light.

2. The method of claim 1, in which:

irradiating said p-type cladding layer and p-type contact layer forms a low-resistance region in said p-type cladding layer and p-type contact layer; and the method additionally comprises making said low resistance region in said p-type cladding layer and p-type contact layer a confinement structure.

3. The method of claim 1, in which:

providing a first beam of laser light comprises providing a converging beam of laser light; and irradiating said semiconductor layers reduces a resistance of the semiconductor layers absorbing said laser light.

4. The method of claim 1, in which providing a beam of laser light includes:

forming a mirror in a part of a region to be irradiated by said laser light having a first wavelength, and blocking said laser light having a first wavelength from irradiating said part of said region with said mirror to define at least partially said shape of said first beam of laser light.

5. The method of claim 1, in which:

in irradiating said semiconductor layers with said first beam of laser light, said first beam of laser light impinges on a surface of said semiconductor layers; and said method additionally comprises further defining said shape of said three-dimensional region by heating at least part of said semiconductor device.

6. The method of claim 1, in which:

in irradiating said semiconductor layers with said first beam of laser light, said first beam of laser light impinges on a surface of said semiconductor layers; and said method additionally comprises further defining said shape of said three-dimensional region by cooling at least part of said semiconductor device.

7. A method for changing resistivity of a three-dimensional region of a semiconductor device, the region having a predetermined shape, the method comprising:

providing a semiconductor device comprising a first layer and a second layer, the first and second layers being layers of different semiconductor materials;

providing a first laser light beam shaped to approximate the predetermined shape and having a first wavelength that is absorbed by the first layer and the second layer; and irradiating said region of said semiconductor device with said first laser light beam without relative lateral movement between said first laser light beam and said semiconductor device, absorption of said first laser light beam by said region locally annealing said first layer and said second layer in said three dimensional region and changing the resistivity thereof;

providing a second laser light beam having a second wavelength that is absorbed by the first layer and that is transmitted by said second layer; and irradiating said first layer with said second laser light beam, absorption of said laser light beam by said first layer locally annealing said first layer and changing the resistivity thereof.

8. The method of claim 7, in which:

the method is for increasing the resistivity of said region of said semiconductor device;

the method additionally includes providing an atmosphere including hydrogen atoms; and irradiation of said region of said semiconductor device is performed in said atmosphere.

9. The method of claim 7, in which:

the method is for decreasing the resistivity of said region of said semiconductor device;

the method additionally includes providing an atmosphere devoid of hydrogen atoms; and irradiation of said region of said semiconductor device is performed in said atmosphere.

10. The method of claim 7, in which providing a laser light beam shaped to approximate the predetermined shape includes:

providing a laser light beam having a first beam shape;

forming a mirror on a surface of said semiconductor device; and illuminating said surface on which said mirror is formed with said laser light beam with said first beam shape, said first beam shape and said mirror collectively forming said laser light beam shaped to approximate said predetermined shape.

11. The method of claim 7, in which providing a first laser light beam shaped to approximate the predetermined shape includes:

providing a first laser light beam having a first beam shape;

forming a lens on a surface of said semiconductor device; and illuminating said surface on which said lens is formed with said first laser light beam with said first beam shape, said first beam shape and said lens collectively forming said first laser light beam shaped to approximate said predetermined shape.

12. The method of claim 7, in which:

said predetermined shape is cone-shaped; and providing a first laser light beam shaped to approximate the predetermined shape comprises:

providing a laser light beam having a substantially parallel beam shape, providing a lens, and focusing the substantially parallel beam shape using said lens to form said first laser light beam shaped to approximate said predetermined shape.

13. The method of claim 7, in which:

the method additionally comprises:

providing a first atmosphere including hydrogen atoms, and providing a second atmosphere devoid of hydrogen atoms; and irradiating with said first laser beam is performed in one of said first atmosphere and said second atmosphere; and irradiating with said second laser light beam is performed in the other of said first atmosphere and said second atmosphere.

* * * * *